United States Patent
Wu et al.

[19]

[11] Patent Number: 6,137,048
[45] Date of Patent: Oct. 24, 2000

[54] PROCESS FOR FABRICATING POLYCRYSTALLINE SEMICONDUCTOR THIN-FILM SOLAR CELLS, AND CELLS PRODUCED THEREBY

[75] Inventors: Xuanzhi Wu, Golden; Peter Sheldon, Lakewood, both of Colo.

[73] Assignee: Midwest Research Institute, Kansas City, Mo.

[21] Appl. No.: 09/218,206

[22] Filed: Dec. 22, 1998

Related U.S. Application Data

[63] Continuation-in-part of application No. 09/149,430, Sep. 8, 1998, and a continuation-in-part of application No. 08/746,798, Nov. 18, 1996, Pat. No. 5,922,142, which is a continuation-in-part of application No. 08/740,347, Nov. 7, 1996, abandoned.

[51] Int. Cl.$^7$ .................................................. H01L 31/00
[52] U.S. Cl. ...................... 136/260; 136/265; 136/256; 438/487
[58] Field of Search ...................... 136/260, 265, 136/256; 438/487

[56] References Cited

U.S. PATENT DOCUMENTS

| | | | |
|---|---|---|---|
| 4,231,808 | 11/1980 | Tabei et al. ............................ | 136/260 |
| 4,445,965 | 5/1984 | Milnes .................................... | 156/624 |
| 4,595,790 | 6/1986 | Basol ...................................... | 136/256 |
| 4,595,791 | 6/1986 | Basol et al. ............................ | 136/256 |
| 4,596,645 | 6/1986 | Stirn ....................................... | 204/192 |
| 4,647,711 | 3/1987 | Basol et al. ............................ | 136/256 |
| 4,709,466 | 12/1987 | McCandless et al. .................. | 437/5 |
| 5,180,476 | 1/1993 | Ishibashi et al. ...................... | 204/192.29 |
| 5,261,968 | 11/1993 | Jordan .................................... | 136/244 |
| 5,304,399 | 4/1994 | Shibata et al. ......................... | 427/386 |
| 5,304,499 | 4/1994 | Bonnet et al. ......................... | 437/5 |
| 5,393,675 | 2/1995 | Compaan ................................ | 437/5 |
| 5,714,391 | 2/1998 | Omura et al. .......................... | 437/5 |

OTHER PUBLICATIONS

Wu X.; Sheldon, P.; Mahathongdy, Y.; Ribelin, R.; Mason, A.; Moutinho, H.R.; Coutts, T.J.; *CdS/CdTe Thin–Film Solar Cell with a Zinc Stannate Buffer Layer*, NREL, Department of Energy, Oct. 1998.

Wu, X.; Sheldon, P.; Coutts, T.J.; Rose D.H.; Moutinho, H.R.; *Application of Cd2SnO4 Transparent Conducting Oxides in Cd2S/CdTe Thin–Film Devices*, NREL, Department of Energy, 26th PVSD, pp. 347–350, Sep. 30–Oct. 3, 1997.

Wu, X.; Sheldon, P.; Coutts, T.J.; Rose, D.H.; Mulligan, W.P.; Moutinho, H.R.; CP394, NREL, Department of Energy, Photovoltaics Program Review, *CdS/CdTe Thin–Film Devices Using a Cd2SnO4 Transparent Conducting Oxide*, pp 693–702, AIP Press, 1997.

*Primary Examiner*—Mark Chapman
*Attorney, Agent, or Firm*—Ken Richardson; Paul J. White

[57] ABSTRACT

A novel, simplified method for fabricating a thin-film semiconductor heterojunction photovoltaic device includes initial steps of depositing a layer of cadmium stannate and a layer of zinc stannate on a transparent substrate, both by radio frequency sputtering at ambient temperature, followed by the depositing of dissimilar layers of semiconductors such as cadmium sulfide and cadmium telluride, and heat treatment to convert the cadmium stannate to a substantially single-phase material of a spinel crystal structure. Preferably, the cadmium sulfide layer is also deposited by radio frequency sputtering at ambient temperature, and the cadmium telluride layer is deposited by close space sublimation at an elevated temperature effective to convert the amorphous cadmium stannate to the polycrystalline cadmium stannate with single-phase spinel structure.

18 Claims, 4 Drawing Sheets

INVENTIVE DEVICE

FIG. 1

FIG. 5
(EXAMPLE 2)

PROCESS FOR FABRICATING POLYCRYSTALLINE SEMICONDUCTOR THIN-FILM SOLAR CELLS, AND CELLS PRODUCED THEREBY

CROSS REFERENCED PATENTS

This patent application is a continuation-in-part of U.S. patent application Ser. No. 09/149,430 filed Sep. 8, 1998 pending for "PHOTOVOLTAIC DEVICES COMPRISING ZINC STANNATE BUFFER LAYER AND METHOD FOR MAKING," This application is also a continuation-in-part of U.S. patent application Ser. No. 08/746,798 filed Nov. 18, 1996, now U.S. Pat. No. 5,922,142 for "PHOTOVOLTAIC DEVICES COMPRISING CADMIUM STANNATE TRANSPARENT CONDUCTING FILMS AND METHOD FOR MAKING" which is a continuation-in-part of U.S. patent application Ser. No. 08/740,347 filed Nov. 7, 1996 now abandoned for "THIN TRANSPARENT CONDUCTING FILMS OF CADMIUM STANNATE." Applicants are both included as named co-inventors of these prior co-pending applications. Both of these applications are incorporated herein by reference.

CONTRACTUAL ORIGIN OF THE INVENTION

The United States Government has rights in this invention under Contract No. DE-AC36-986010337 between the U.S. Department of Energy and the National Renewable Energy Laboratory (NREL) operated for the U.S. Department of Energy by Midwest Research Institute, Battelle and Bechtel.

FIELD OF INVENTION

The present invention relates generally to photovoltaic devices and more particularly to polycrystalline thin-film CdS/CdTe heterojunction solar cells comprising a thin transparent conducting film of cadmium stannate and a buffer layer of zinc stannate. Improved methods for their fabrication are disclosed and claimed which simplify the steps for applying the first three layers of the devices (transparent conducting oxide or TCO layer, buffer layer and CdS window layer).

BACKGROUND OF THE INVENTION

Photovoltaic devices (solar cells) utilize the specific conductivity properties of semiconductors to convert the visible and near visible light energy of the sun into usable electrical energy. This conversion results from the absorption of radiant energy in the semiconductor materials which frees some valence electrons, thereby generating electron-hole pairs. The energy required to generate electron-hole pairs in a semiconductor material is referred to as the band gap energy, which in general is the minimum energy needed to excite an electron from the valence band to the conduction band.

Cadmium telluride (CdTe) has long been recognized as a promising semiconductor material for thin-film solar cells due to its near-optimum band gap of 1.44 eV and high absorption coefficient. CdTe is typically coupled with a second semiconductor material of different conductivity type such as cadmium sulfide (CdS) to produce a high-efficiency heterojunction photovoltaic cell. Small-area CdS/CdTe heterojunction solar cells with solar energy to electrical energy conversion efficiencies of more than 15% and commercial-scale modules with efficiencies of about 9% have been produced using various deposition techniques, including close-space sublimation or "CSS" (U.S. Pat. No. 5,304,499, issued Apr. 19, 1994 to Bonnet et al.), spray deposition (e.g., J. F. Jordan, Solar Cells, 23 (1988) pp. 107–113), and electrolytic deposition (e.g., B. M. Basol, Solar Cells), 23 (1988), pp. 69–88).

Thin film CdS/CdTe superstrate-type solar cells typically comprise an optically transparent substrate through which radiant energy enters the device, the intermediate layers of dissimilar semiconductor materials (e.g., CdS and CdTe), and a conductive film back contact. Generally, when the superstrate is not electrically conductive, a thin layer of transparent conductive oxide (TCO) is deposited between the substrate and the first semiconductor layer to function as a front contact current collector. However, conventional TCOs, such as tin oxide, indium oxide, and zinc oxide, have high sheet resistivities (typically about 10 ohms per square), and hence poor conductivity, at thicknesses necessary for good optical transmission. Thus, because of their high sheet resistivities, conventional TCOs are not efficient current collectors in solar cells of any appreciable size (i.e., greater than about one square centimeter), particularly in commercial-scale modules.

One way around the current collection limitation described above is to incorporate a more efficient current collection means, such as a front contact current collector grid, into the TCO layer. These current collector grids generally comprise a network of very low resistivity material that collects electrical current from the transparent conductive layer and channels the current to a central current collector. For example, U.S. Pat. Nos. 4,647,711; 4,595,790; and 4,595,791 to Basol et al. each disclose a photovoltaic device having a metallic conductive grid integrated into the TCO layer to decrease the series resistance of the device. Although supplementing the TCO layer with a metallic grid may theoretically enhance the current collecting capacity of the solar cell, because the grid material is not optically transparent, the presence of the grid can actually reduce the overall conversion efficiency of the photovoltaic device. Other disadvantages and potential problems commonly associated with the use of current collector grids include diffusion of the grid material into the semiconductor layers, short circuiting of the device, and incomplete or uneven deposition of the semiconductor layers due to the geometry of the grid.

It is desirable to create a transparent conducting film between the substrate and the first semiconductor layer that has both low electrical sheet resistance and high optical transmission. Low sheet resistance is a primary requirement of any contact on a semiconductor device to reduce the barrier to carrier flow between the semiconductor device and the external electronic circuit. High optical transmission is also very important to increase the amount of electromagnetic radiation that is absorbed by the semiconductor material, thereby optimizing the operation of the photovoltaic device by maximizing the number of photogenerated electrons available for collection. Unfortunately, it is difficult to provide both of these conditions simultaneously, low sheet resistance and high optical transmission, in the transparent conducting layer using conventional methods and TCO materials. As previously stated, conventional TCOs can have high inherent resistivity. High sheet resistance causes ohmic losses in the transparent conducting film which decreases the overall conversion efficiency of the device. To reduce the sheet resistance of these conventional TCO films, and thus potentially improve device performance, the TCO must be deposited as a relatively thick layer. However, the thicker the transparent conducting film, the lower the transmission and thus the less electromagnetic radiation that reaches the semiconductor material, thereby reducing the conversion efficiency of the solar cell.

Another disadvantage associated with conventional TCO layers in thin film solar cell devices is their generally rough surface morphology. For example, one of the most popular TCOs currently in use, tin oxide ($SnO_2$), when deposited as a thin film by chemical vapor deposition (CVD) typically produces an average surface roughness of between about 100 and 250 Å. Such high surface roughness has several significant disadvantages. First, it is well known that high-efficiency thin film CdS/CdTe solar cells require a very thin semiconductor (CdS) window layer, typically with a thickness of around 600 Å. However, this high $SnO_2$ surface roughness coupled with a thin CdS layer can significantly affect the uniformity of both the CdS layer and the resulting $CdS_{1-x}Te_x$ intermixed layer which will be described in more detail below. If the CdS and $CdS_{1-x}Te_x$ layers are not uniform or complete, this has the adverse effect of increasing interface defects and the density of localized TCO/CdTe junctions, thus reducing open circuit voltage and fill factor, and can ultimately cause severe degradation. Second, a high-surface roughness increases the junction area of the solar cell, which causes an increased dark current, and hence, a lower open circuit voltage and fill factor. Finally, it is desirable to create a smooth surface on the transparent conducting film so that the thickness of the semiconductor window layer can be minimized. Having a very thin window layer means more absorption of optical photons (particularly energy of short wavelength) in the active region of the semiconductor device, and thus improved photovoltaic conversion efficiency.

Another problem with conventional $SnO_2$ films is that they can be very difficult to pattern which limits their commercial applications. It is especially important for commercial applications that the transparent conducting film be easy to pattern or etch, particularly for advanced module and display device processing. Transparent conducting films suitable for commercial use must also be easy to produce, inexpensive, durable, stable under standard processing conditions, and chemically compatible with adjacent semiconductor materials, specifically the CdS window layer.

A well-known advantage of heterojunction solar cells, such as CdS/CdTe structures, is that they can have a relatively wide band gap in the window-layer component of the cell (e.g., CdS with a bandgap of about 2.4 eV) which allows more of the electromagnetic solar radiation to pass through the front layer component and penetrate into the underlying direct band gap component where the electromagnetic solar radiation is absorbed (e.g., CdTe with a bandgap of about 1.44 eV), to create electron-hole pairs. However, the window-layer component with its wider band gap does absorb some of the electromagnetic solar radiation, especially in the shorter wavelengths below about 500 nm before it can reach the underlying absorption layer. Therefore, that shorter wavelength, e.g., blue light energy, is lost as heat instead of being usefully converted to electric current. Reducing the thickness of the window layer reduces this solar energy absorption in the window layer so that it can be absorbed near the CdS/CdTe junction, yielding increased short-circuit current ($J_{sc}$) and improved overall conversion efficiency of the device. In CdS/CdTe solar cells, such reduction in the thickness of the CdS window layer allows more of the shorter wavelength or blue solar radiation to reach and be absorbed by the CdTe layer, thus improving the blue spectral response of the device.

Unfortunately, reducing the thickness of the CdS film can also cause other problems that are detrimental to the electrical quality and performance of the heterojunction device. For example, the thinner the CdS layer, the greater the probability of pinhole defects which create localized TCO/CdTe junctions that result in reduced open-circuit voltage ($V_{oc}$) and fill factor (F.F.). Creation of such localized TCO/CdTe junctions can lower the $V_{oc}$ of a CdS/CdTe heterojunction solar cell from a range of 800–850 mV down to a range of about 300–400 mV, depending on the severity and density of the pinholes, thickness of the CdS layer and several other factors. Therefore, while thinner CdS window layers are desirable for obtaining higher solar energy conversion efficiency and high $J_{sc}$, current technology is limited in how thin the CdS front or window layer can be made before the reduction of $V_{oc}$ and fill factor (F.F.) due to creation of pinholes as described above.

Another problem commonly associated with fabrication of thin film semiconductor devices is the formation of the back electrical contacts in a low resistance, ohmic manner to the CdTe layers. It is well known that p-CdTe is very difficult to dope to high levels. One conventional technique is to chemically etch the CdTe layer prior to deposition of the metallic-back contact to form a tellurium-rich $p^+$ conductivity region at the exposed surface of the CdTe. Then the back contact is either deposited on the etched surface of the CdTe layer using metals such as gold or nickel, or it is formed by applying a HgTe:Cu doped graphite paste. Unfortunately, conventional chemical etching is difficult to control and the CdTe layer is polycrystalline, so excessive chemical etching can preferentially etch grain boundaries in the polycrystalline CdTe, removing Cd to leave highly conductive Te channels extending through the CdTe layer to the CdS/CdTe junction. This is detrimental by often corroding through the CdS layer and into close proximity to the TCO layer. Once the back contact is deposited, such channels can form highly conductive shunts that cause electrical short circuits between the front TCO contact and the back metal contact and reduce the $V_{oc}$ of the device. Therefore, while the chemical etching can enhance a desirable ohmic contact between the CdTe layer and the back contact layer, it can also have a detrimental effect on the $V_{oc}$ and fill factor (F.F.), thereby adversely affecting solar energy conversion efficiency of the device.

Before the chemical etching step described above, an annealing step, which typically involves heating the CdS/CdTe semiconductor heterojunction structure in a $CdCl_2$ atmosphere, is considered by persons skilled in the art to be almost essential to produce high-efficiency CdTe devices. Such annealing provides a number of benefits, including increased grain size, grain boundary passivation, improved CdS/CdTe interface alloying, and reduced lattice mismatch between the CdS and CdTe layers. Unfortunately, $CdCl_2$ heat treatment, like chemical etching, is difficult to control, and over-processing can significantly reduce both device performance and product yield. Moreover, it is believed that grain growth, although a generally desirable result of $CdCl_2$ heat treatment, can induce stress at the TCO/CdS interface, causing blistering or peeling of the semiconductor layers.

Most efforts to solve these problems with constructing high-efficiency CdS/CdTe semiconductor heterojunction devices have been directed to refining layer compositions, thicknesses, and processing control parameters to optimize a balance between the beneficial and adverse effects described above. However, U.S. Pat. No. 5,261,968 issued to Jordan addresses the problem of pinhole shunts between the TCO and CdTe layers through the CdS layer by interposing a low conductivity tin oxide layer between the high conductivity TCO layer and the CdS layer. In that patent, the TCO is a high-conductivity tin oxide, while the interposed low conductivity tin oxide layer has its carrier concentration adjusted by a cadmium, zinc, or other metal dopant. However, solutions to the problem of electrical short circuits through grain boundary shunts from chemical etching of the CdTe layer and to the problems of blistering and peeling between the TCO/CdS layers and other degradation from overprocessing in the annealing step have remained elusive.

It would be desirable to develop improved processes for fabricating such semiconductor devices, especially if more steps could be conducted at ambient temperature to reduce the thermal budget for the process.

U.S. Pat. No. 5,393,675 to Compaan discloses a thin film photovoltaic cell having CdS and CdTe layers deposited sequentially onto a conductive tin oxide layer by RF magnetron sputtering. However, the patent does not disclose a CdTe device including layers of cadmium stannate and zinc stannate, nor a method of depositing layers of a transparent conducting oxide or CdS at ambient temperature.

U.S. Pat. No. 4,231,808 to Tabei et al. discloses methods for manufacturing CdTe thin film solar cells containing a CdTe thin layer involving a shallow p-n homogeneous junction. An n-CdTe film was deposited by RF sputtering at 300° C., then heat treated to form a shallow p-n junction. This patent does not disclose or suggest a heterojunction CdS/CdTe thin film device such as claimed herein, nor a method for depositing the first two or three layers of such a cell by RF sputtering at ambient temperature.

U.S. Pat. No. 4,445,965 to Milnes discloses a method for making thin semiconductor films for use in solar cells, using single or near-single crystal material of CdTe or related semiconductors. There is no suggestion of a process for fabrication of polycrystalline CdS/CdTe thin-film solar cells.

U.S. Pat. No. 4,596,645 to Stirm discloses a reactive sputtering technique for making a high conductivity, n-doped semiconductor film for heterojunction devices.

U.S. Pat. No. 5,180,476 to Ishibashi et al. discloses methods for making transparent conductive films by sputter deposition at temperatures over 200° C., using materials based upon oxides of indium, tin, zinc, cadmium/tin or cadmium/indium. There is no suggestion of sputter deposition of materials such as those used in the present invention at ambient temperatures.

U.S. Pat. No. 4,709,466 to McCandless et al. discloses a post-deposition annealing process for fabricating thin-film photovoltaic devices in which the devices' fill factor is increased from 46 to 54 percent.

U.S. Pat. No. 5,714,391 to Omura et al. discloses a method for manufacturing a compound semiconductor thin film for a photoelectric or solar cell device. The thin film is derived from a metal sulfide produced by thermal decomposition of a sulfur-containing metal organic compound. CdS/CdTe cells are said to be improved by employing such a CdS layer deposited at a substrate temperature of 450° C. There is no suggestion of depositing such layers at ambient temperatures.

Commercial scale photovoltaic modules having efficiencies of 6–9 percent have been prepared by several CdTe deposition techniques, including modified close-space sublimination (CSS), chemical spray deposition and electrodeposition. However, the first three layers (including a tin oxide TCO layer, an insulating tin oxide buffer layer and a CdS window layer) were deposited conventionally at high temperatures (e.g., chemical vapor deposition, CSS and spray techniques) or in liquid solution (i.e., electro deposition techniques) by at least three manufacturers, as outlined in Table 1. Such high temperature deposition steps or the treatment of large amounts of liquid wastes will increase manufacturing costs.

In addition, the use of different deposition techniques for applying these three layers will also increase the investment in manufacturing equipment. In the present process, as outlined in Table 1, these first three steps can be carried out by radio frequency (RF) sputtering at room or ambient temperature.

TABLE 1

| Manufacturer | TCO layer | Buffer layer | CdS Window Layer |
| --- | --- | --- | --- |
| No. 1 | CVD-SnO$_2$ 550°–600° C. | Sputtered I—SnO$_2$ (for R & D) | CSS-CdS 550°–600° C. |
| No. 2 | CVD-SnO$_2$ 550°–600° C. | Spray-Cd-doped SnO$_2$ 500°–550° C. | Spray-CdS 500–550° C. |
| No. 3 | CVD-SnO$_2$ 550°–600° C. | NA | Electro-deposition-CdS ~100° C. |
| Present work | RF sputtered Cd$_2$SnO$_4$, RT | RF sputtered Zn$_2$SnO$_4$, RT | RF sputtered CdS, RT |

Our prior application U.S. Ser. No. 08/746,798 now U.S. Pat. No. 5,922,142 discloses methods of fabricating similar devices, comprising steps of RF sputter coating amorphous cadmium stannate onto a substrate, coating a second substrate with CdS, contacting the layers of cadmium stannate and CdS, then heating the substrates and layers of material to crystallize the cadmium stannate layer, cooling the substrates, and separating the two substrates. While producing a substrate with a layer of polycrystalline cadmium stannate providing improved optical and electrical properties, this method is very cumbersome on a commercial scale.

Our prior application Ser. No. 09/149,430 discloses methods of preparing similar devices including a buffer layer of zinc stannate interposed between the TCO front contact layer (which can be cadmium stannate) and the CdS front window layer of a CdS/CdTe heterojunction device. The method includes steps of applying a TCO layer to a transparent substrate, depositing a zinc stannate layer onto this TCO layer, then depositing as thin films two or more layers of semiconductor materials to form a p/n or p/i/n junction onto the layer of zinc stannate, and finally depositing an electrically conductive film onto the thin film layers of semiconductor materials to form a rear contact.

SUMMARY OF THE INVENTION

The main aspect of the present invention is improved methods for fabricating thin-film CdS/CdTe heterojunction photovoltaic devices, in particular methods for applying at least two layers of the devices using RF sputtering at ambient temperatures. Such methods can result in reduced thermal budgets and process time for the overall manufacturing process.

Another aspect of the invention is to eliminate a separate annealing step for converting amorphous cadmium stannate to polycrystalline material by integrating this process into other steps at elevated temperature.

To achieve these and other objects, aspects and advantages of the invention, methods for fabricating thin-film CdS/CdTe heterojunction photovoltaic devices are provided, comprising the steps of:

a) depositing a layer of cadmium stannate on a transparent substrate by radio frequency sputtering at ambient temperature to act as a transparent conductive oxide (TCO) layer forming a front contact;

b) depositing a zinc stannate layer on the TCO layer by radio frequency sputtering at ambient temperature to form a buffer layer;

c) depositing a first semiconductor window layer upon the buffer layer;

d) depositing a second semiconductor layer upon the window layer to form a heterojunction; and e) heat treating the device formed by steps (a) through (d) to convert the cadmium stannate layer to a substantially single-phase material with a spinel crystal structure.

The layers of cadmium and zinc stannates are normally amorphous as applied. Preferably, the first and second semiconductor layers are cadmium sulfide and cadmium telluride respectively. When the second semiconductor layer is applied by close-space sublimation, the heat treatment step (e) can be accomplished simultaneously.

Following these steps, the device is preferably subjected to treatment with cadmium chloride at elevated temperature, which temperature is lower than that in step (e), and a thin electrically conductive film is deposited onto the cadmium telluride layer to serve as a rear electrical contact. In preferred embodiments, the cadmium sulfide window layer is also deposited by radio frequency sputtering at ambient temperature, and the cadmium telluride layer is deposited by close space sublimination at a temperature of at least about 500° C., which temperature is effective to convert the cadmium stannate layer to a single-phase spinel crystal structure (thereby eliminating the separate annealing step).

In another embodiment, the cadmium telluride layer is applied at lower temperature (Ambient temperature—550° C.) by methods including electrodeposition, screen printing, sputtering, spraying or physical vapor deposition (PVD) and the device is then subjected to heat treatment in the range of from about 500° to about 630° C.

In yet another embodiment, the cadmium sulfide layer can be applied by close space sublimation, preferably at temperatures in the range of from about 500° to about 600° C., followed by the depositing of the cadmium telluride layer by close space sublimation, preferably at temperatures in the range of from about 500° to about 630° C.

The embodiment presently preferred is a method comprising the steps of:

a) depositing a layer of amorphous cadmium stannate on a transparent substrate by radio frequency sputtering at ambient temperature to act as a TCO layer forming a front contact;

b) depositing a zinc stannate layer on the TCO layer by radio frequency sputtering at ambient temperature to form a buffer layer;

c) depositing a cadmium sulfide window layer upon the buffer layer by radio frequency sputtering at ambient temperature;

d) depositing a cadmium telluride layer upon the window layer by close space sublimination at a temperature of at least about 500° C.; and e) treating the device formed by steps (a) through (d) with cadmium chloride at elevated temperature which temperature is lower than that in step (d), thereafter depositing a thin electrically conductive film upon the cadmium telluride layer to serve as a rear electrical contact, whereby The amorphous cadmium stannate is converted to a substantially single-phase polycrystalline material with a spinel structure in step (d).

In accordance with the invention, thin-film CdS/CdTe heterojunction photovoltaic devices prepared by all of the methods described above are provided.

Other aspects of this invention will appear from the following description and appended claims, reference being made to the accompanying drawings forming a part of this specification wherein like reference characters designate corresponding parts in the several views.

Before explaining the disclosed embodiments of the present invention in detail, it is to be understood that the invention is not limited in its application to the details of the particular arrangements shown, since the invention is capable of other embodiments. Also, the terminology used herein is for the purpose of description and not of limitation.

DESCRIPTION OF THE PREFERRED EMBODIMENTS

Figure 1:
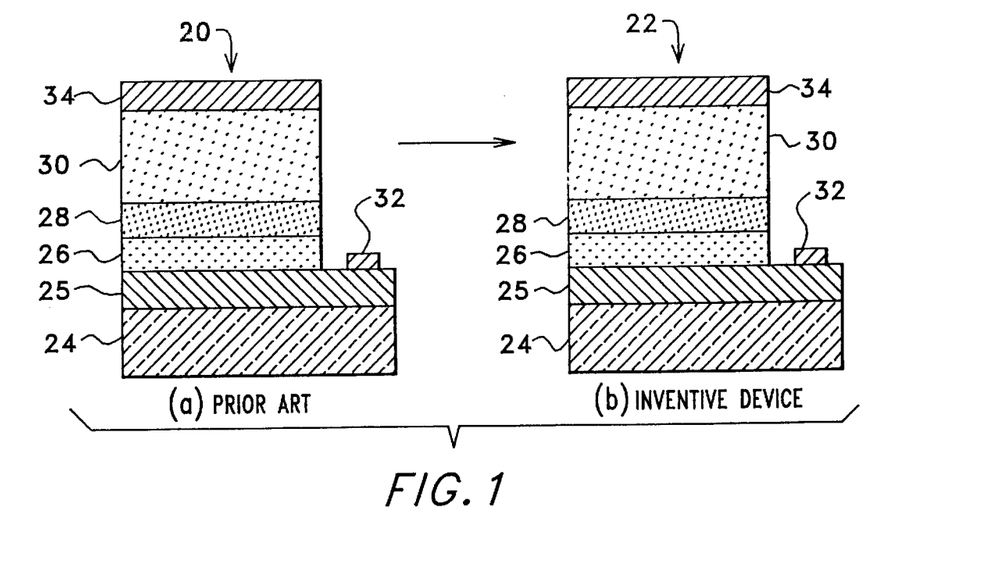
FIG. 1 is a cross-sectional view (not in actual scale or proportion) of two photovoltaic devices, such as solar cells, representing a prior art device and a device of the present invention.

FIG. 1 shows cross-sectional views of two photovoltaic devices—one of the prior art and one of the improved device of the present invention. The prior art and inventive devices, generally referred to by reference numerals 20 and 22, respectively, each contain a transparent substrate 24 through which radiant energy enters the device. The substrate can be made of any transparent material that can withstand the processing temperatures employed, such as glass, silica, or quartz. A thin transparent conductive oxide (TCO) film 25 is deposited onto the transparent substrate. In the prior art device the TCO layer is tin oxide or indium tin oxide (ITO), while in the present invention the TCO layer is cadmium stannate. Cadmium stannate TCO layers have numerous advantages including superior electrical, optical, and mechanical properties and stability at elevated temperatures, as described in our previous application U.S. Ser. No. 08/746,798. Each device includes an insulating buffer layer 26 atop the TCO layer, which in the prior art is also an insulating tin oxide film and in the present invention is zinc stannate. The cadmium stannate layer 25 is deposited between the transparent substrate 24 and the buffer layer 26 to serve as a front contact current collector, thus replacing the conventional TCO films commonly used in photovoltaic devices. A first semiconductor layer 28 is deposited upon the buffer layer 26 and a second semiconductor layer 30 is deposited upon the first semiconductor layer to form a heterojunction.

In both the prior art and present invention devices, the first semiconductor layer is preferably of CdS and can be termed a "window" layer 28. This term will be used hereafter in this application, as this layer is transparent to a large portion of the electromagnetic energy entering from the transparent substrate. However, the CdS layer in the prior art device is deposited at about 500°–600° C. by CSS techniques or in liquid solution by chemical bath deposition (CBD) at about 100° C., while in the preferred embodiments of the present invention, the CdS layer is applied by RF sputtering at ambient temperature. By ambient or room temperature, it is meant that the sputtered layer is applied at a temperature which is not elevated, but is normal in the laboratory or manufacturing facility, e.g. less than about 40° C.

To provide the desired junction, the conductivities of the first and second semiconductor layers are not the same. Both devices are shown with a second semiconductor layer of CdTe, as this material has highly desirable properties. However, other combinations of semiconductor materials of differing conductivities can be used in the devices of this invention to produce a heterojunction, including, but not limited to, CdS/CdZnTe, CdS/ZnTe, CdS/CIS and CdS/CIGS (CIS=copper, indium, selenium; CIGS=copper, indium, gallium, selenium.) In addition to these dissimilar semiconductor materials, the present invention can also be practiced using other semiconductor material combinations, such as amorphous silicon and polycrystalline thin-film silicon.

A back electrical contact 34 is applied to the second semiconductor layer of CdTe or other material and is in ohmic contact therewith. Back electrical contacts can be of metal, semicondutor, or combination thereof, e.g. gold, ZnTe or nickel, or other suitable conductive materials, such as an HgTe-doped graphite paste. The devices 20 and 22 can include a front electrical contact 32 on the TCO film 25, the function and construction of which is known in the art and not a part of this invention.

As will be apparent to those skilled in the art, substrate 24 must be optically transparent over the range of light wavelengths for which transmission through the substrate is desired. Also, substrate 24 must be of a material capable of withstanding heat treatment at temperatures of 500° C. or more, as described below, and the TCO film 25, normally of cadmium stannate, must adhere to the substrate 24 material. The thermal expansion coefficient of the substrate 24 material must be close enough to that of the TCO film 25 and the semiconductor layers to prevent cracking or buckling of these films during heat treatment. Optionally, an anti-reflective coating can be applied to the outer surface of substrate 24, using known materials such as $MgF_2$.

The TCO layer 25 can comprise any suitable transparent conductive oxide material known in the art, such as tin oxide, indium oxide, indium tin oxide (ITO), zinc oxide or cadmium stannate. Because of its properties and its ambient temperature method of deposition, cadmium stannate is preferred. Compared with the conventional tin oxide TCO films, cadmium stannate films are more conductive, more transparent, smoother (i.e., have lower surface roughness) and are exceptionally stable to elevated temperatures. The preferred method of depositing cadmium stannate by RF sputtering at ambient temperatures is described in our application U.S. Ser. No. 08/746,798. The process is normally carried out in an oxygen atmosphere.

Once the substrate 24 is fabricated by techniques known in the art, the TCO layer 25 of cadmium stannate is deposited by RF sputtering at ambient temperature. The cadmium stannate typically is applied in amorphous form. Then a buffer layer 26 of zinc stannate is deposited, also by RF sputtering at ambient temperature in an oxygen atmosphere, as described in detail in our application Ser. No. 09/149,430. The zinc stannate is also applied in amorphous form, and is later recrystallized. Compared to conventional tin oxide buffer layers, such zinc stannate layers provide a wider bandgap, higher transparency, high resistivity (comparable to that of the CdS film) and excellent chemical stability.

A window layer 28 of CdS is normally applied next, preferably also by RF sputtering at ambient temperature in an argon atmosphere. In an alternate embodiment, the CdS layer can be deposited by close-space sublimation at a suitable temperature, e.g. 500°–600° C. A thin layer of CdTe or other semiconductor 30 is then deposited upon the window layer of CdS to form a heterojunction. Preferably the CdTe layer is applied by close-space sublimation at a temperature of at least about 500° C. The resulting temperature profile is effective to convert the cadmium stannate TCO layer to a single-phase spinel crystal structure with improved electrical and optical properties, and also to convert the zinc stannate buffer layer to a polycrystalline form.

Integrating this crystallization process into the deposition step for CdTe eliminates a separate annealing step for effecting such conversions. In alternate embodiments, the CdTe layer can be deposited at lower temperatures, i.e. from about ambient temperature to about 550° C., by processes such as electrodeposition, screen printing, sputtering, spraying or physical vapor deposition (PVD), followed by heat treatment of the device at a temperature in the range of from about 500° to about 630° C., which treatment is also effective to crystallize the layers of cadmium stannate and zinc stannate.

Finally, the back electrical contact is applied to the device by any suitable method, such as evaporating, sputtering or screen printing.

Figure 2:
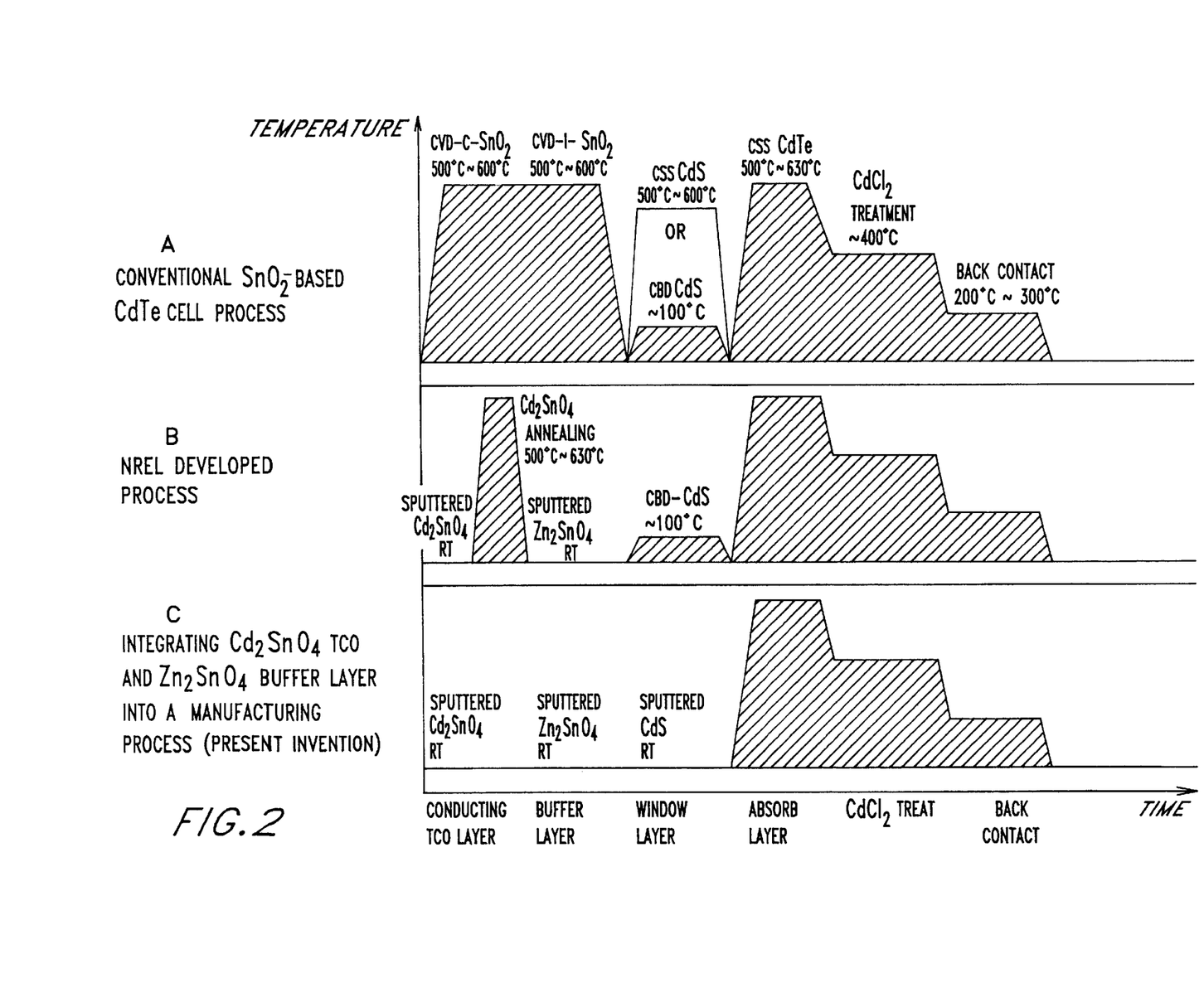
FIG. 2 is a graph showing comparative temperature profiles and steps of two prior art processes for fabricating photovoltaic devices and the preferred method of the present invention.

FIG. 2 illustrates temperature-time profiles for three processes of fabricating CdS/CdTe photovoltaic cells. FIG. 2A is a conventional process for producing a cell with a tin oxide TCO layer. FIG. 2B is the process of our previous application Ser. No. 09/149,430, and FIG. 2C is the preferred process for fabricating a cell using a cadmium stannate TCO layer, zinc stannate buffer layer, and cadmimum sulfide window layer, applying the three initial layers by RF sputtering at ambient temperature. The advantages of the temperature profile of this inventive process will be apparent upon inspection. In the conventional process of FIG. 2A, tin oxide TCO and buffer layers are deposited by chemical vapor deposition (CVD) at temperatures of 500°–600° C. The letters "C" and "I" in FIG. 2A indicate conductive and insulating layers of tin oxide. Following this, a CdS semiconductor layer is deposited by either close-space sublimation at more than 500° C. or by chemical bath deposition at about 100° C. After these initial three steps, a CdTe semiconductor layer is deposited by close-space sublimation at 500°–630° C., followed by treatment with $CdCl_2$ vapor at about 400° C. and the application of the back contact at about 200°–300° C. Due to the requirement of repeated heated and cooling of the substrate in the initial stages, this process involves over a dozen separate steps. When applied to commercial scale products (which can be as large as eight feet square), this can be very time consuming. For purposes of comparison, the three final steps just described will be essentially identical in the three processes of FIG. 2. Nevertheless, it will be apparent that the conventional process requires several more steps than the process of the present invention.

In the process of FIG. 2B, the high temperatures required for the application of the tin oxide layers of FIG. 2A are largely eliminated by the depositing of cadmium stannate and zinc stannate as the TCO and buffer layers, respectively, except that the cadmium stannate requires annealing at 500°–630° C. for recrystallization before the zinc stannate is applied. The CdS semiconductor layer is deposited by chemical bath deposition at about 100° C., as can be done in the process of FIG. 2A. The final three steps are as described above for the process of FIG. 2A.

In the preferred process of the present invention (FIG. 2C), the same layers of cadmium stannate, zinc stannate and cadmium sulfide are applied as in the process of FIG. 2B, but all three layers are preferably applied by RF sputtering at ambient temperature. The subsequent three steps of depositing CdTe by CSS, $CdCl_2$ treatment and application of a back contact are the same as in the processes of FIGS. 2A and 2B, except that the temperature profile of the CSS step itself is effective to convert the cadmium stannate TCO layer to a single phase spinel crystal structure. This eliminates the necessity of heating the cadmium stannate before the second step to recrystallize it. An additional optional step not shown is to anneal the first three layers in hydrogen at about 400° C. for removing oxides from the CdS surface before CdTe deposition.

Figure 3:
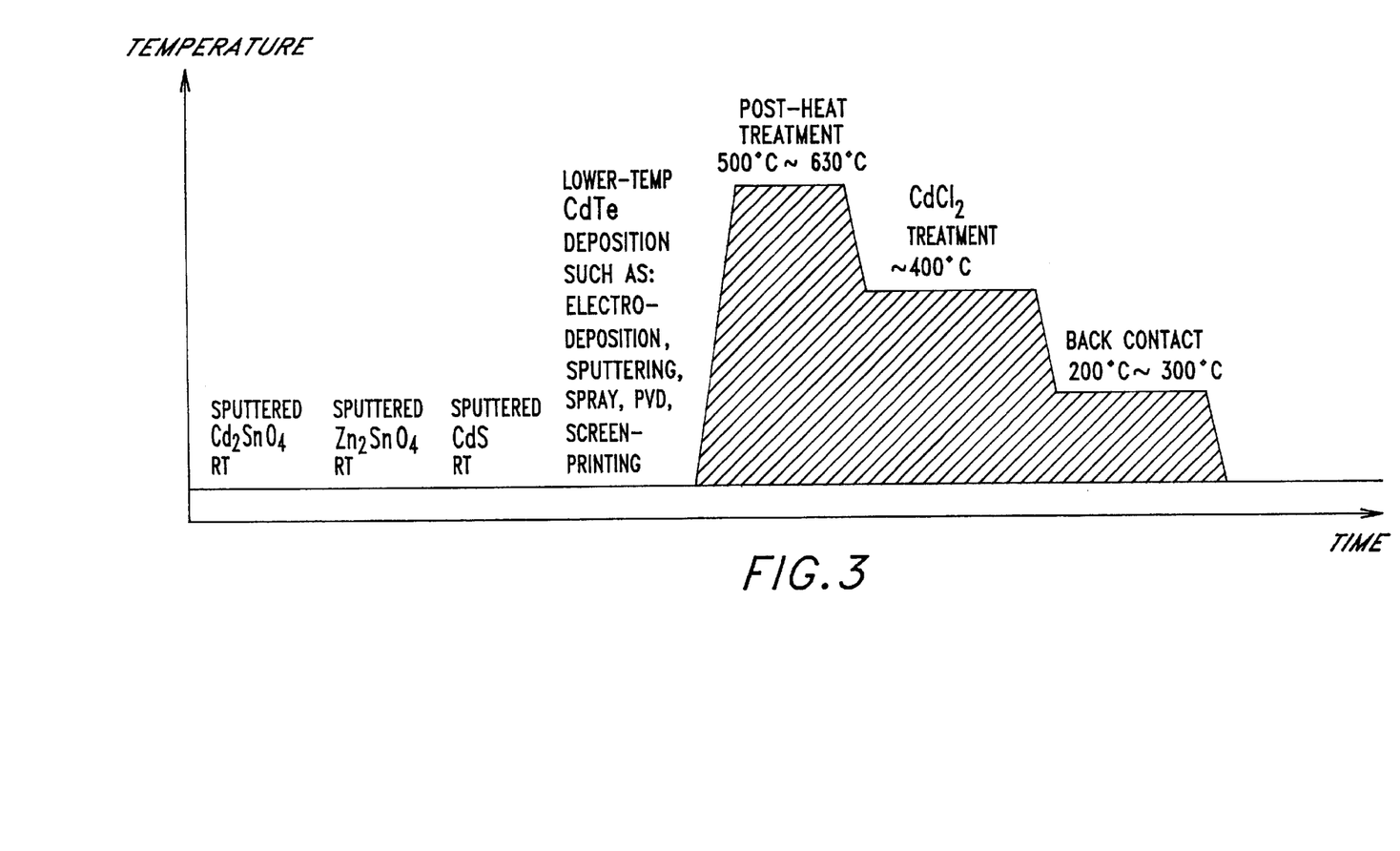
FIG. 3 is a graph showing temperature profiles and steps of an alternative embodiment of the present invention.

FIG. 3 illustrates an alternate procedure for the method of the invention. The first three layers of cadmium stannate, zinc stannate and CdS are applied by RF sputtering at ambient temperature as in FIG. 2C, but as the fourth step, the CdTe absorption layer is applied by a lower temperature (i.e. ambient temperature—550° C.,) process such as electrodeposition, screen printing, sputtering, PVD, or spraying. This step is followed by a heat treatment at about 500°–630° C. for a time effective to convert the amorphous cadmium stannate to the single-phase spinel crystal structure. Then the device is subjected to treatment in a $CdCl_2$ vapor at about 400° C., and the back contact is applied and annealed at a temperature of range of about 200°–300° C. As is apparent from the graphs, the temperature profile for the final three steps of the process is similar to those in FIGS. 2A, 2B and 2C, except that the portions at elevated temperature are displaced to the right, i.e. delayed in time.

Figure 4:
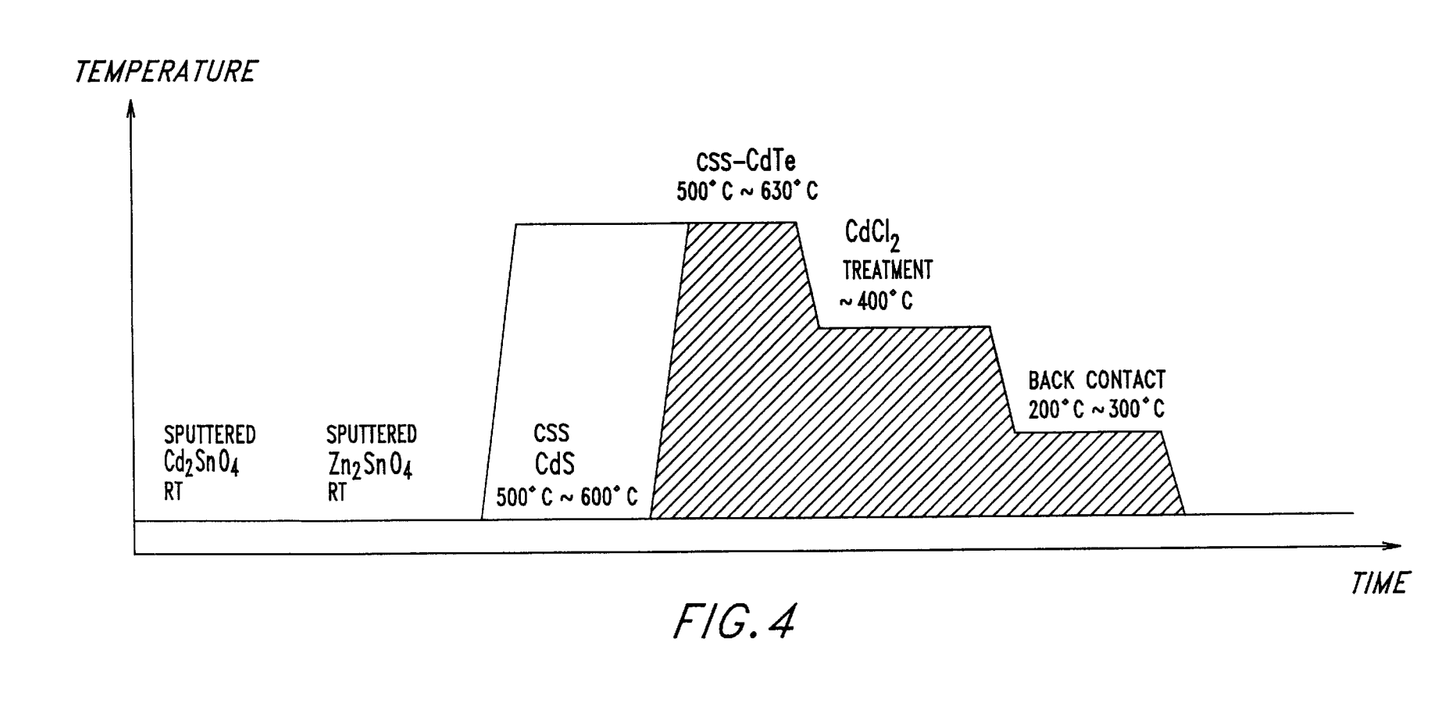
FIG. 4 is a graph showing temperature profiles and steps of a second alternative embodiment of the present invention.

FIG. 4 illustrates a second alternate version of the method of the invention. After the first two layers of cadmium stannate and zinc stannate are deposited by RF sputtering at ambient temperature, the CdS window layer is deposited by close-space sublimation at about 500°–600° C. The absorption layer of CdTe is then applied by close-space sublimation, preferably at a temperature range of about 500° C. to about 630° C. The device is then treated with $CdCl_2$ at about 400° C. and the back contact is applied and annealed at a temperature range of about 200°–300° C.

The resistivity of cadmium stannate films is significantly lower (approximately two to six times lower) than that of conventional $SnO_2$ films deposited on similar substrates. Thus, the photovoltaic devices of the present invention offer the important advantage of reduced series resistance and increased fill factor, and hence improved efficiency, due to the presence of these low-resistivity cadmium stannate films. However, if the TCO film is made too thick, decreased optical transmission may result. Although this advantage applies to both small and large-area photovoltaic devices, reducing the series resistance in commercial modules is of particular interest since the width of subcells can be significantly increased without significant resistive power losses. Moreover, because the width of subcells is increased, fewer scribe lines are required, thus improving throughput and reducing manufacturing costs.

Another significant advantage associated with the photovoltaic device of the present invention is the improved optical transmission and electrical resistance of the cadmium stannate film, as compared to existing devices comprising conventional TCO films. As previously discussed, conventional TCOs can have high inherent sheet resistances, which causes ohmic losses in the transparent conducting film and reduces the efficiency of the device. Normally, to reduce the sheet resistance of these films, the thickness of the TCO layer must be increased, which decreases the optical transmission. Because of the superior conductivity of the cadmium stannate film, the TCO can be deposited in a thin layer, thereby improving the optical transmission and hence the amount of electromagnetic radiation that reaches the semiconductor material. Although the basis for this improvement is not fully understood, it is believed to result from the unusually high electron mobility of the cadmium stannate film, as previously discussed. Thus, the photovoltaic device of the present invention with cadmium stannate TCO offers improved device short circuit currents, and hence improved performance.

A yet further significant advantage of the photovoltaic device of the present invention is the improved surface morphology of the transparent conducting film which provides improved device performance. FIG. 4 of our previous application U.S. Ser. No. 08/746,798 provides a comparison of the surface morphologies of a conventional $SnO_2$ film (FIG. 4a) and a cadmium stannate film (FIG. 4b). As can be seen in FIG. 4, the surface of the cadmium stannate film is significantly smoother than the surface of the $SnO_2$ film. Data obtained from atomic force micrography (AFM) indicate that the average surface roughness of the cadmium stannate film is an order of magnitude lower than that of the $SnO_2$ film. It is well known that in a heterojunction solar cell, reducing the window layer absorption increases short circuit current ($J_{sc}$). In CdS/CdTe solar cells, this is typically achieved by reducing the CdS thickness (C. Ferekides, et al., 23rd IEEE SPVC Proc. (1993) pp. 389–393). In general, a CdS/CdTe solar cell with a thin CdS layer has much better spectral response in the blue. However, reducing the thickness of the CdS film to between 600 Å and 700 Å can reduce the open circuit voltage and fill factor. During CdTe depositions and subsequent $CdCl_2$ heat-treatment, the CdS film is either partially or completely consumed, forming a $CdS_{1-x}Te_x$ intermixed layer. The CdS consumption reportedly increases as the CdS film thickness decreases (B. E. McCandless and S. S. Hegedus, 22nd IEEE SPVC Proc. (1991) pp. 967–972). As the CdS film thins, pinholes can develop and create TCO/CdTe junctions which reduces the open circuit voltage and fill factor. The probability of pinhole formation increases as the $SnO_2$ surface roughness increases (A. Rohatgi, et al., 22nd IEEE SPVC Proc. (1991) pp. 962–966). Thus, because of the considerable improvement in surface morphology of cadmium stannate films and the concomitant reduction in pinhole formation, the photovoltaic device of the present invention provides a significant improvement in device performance.

Cadmium stannate films are also much easier to pattern than conventional $SnO_2$ films (by etching in either HCl or HF), thus facilitating production and significantly expanding commercial applications. Patterned cadmium stannate films provide excellent edge definition, which is particularly important for certain commercial applications, such as in advanced photovoltaic module and flat panel display device processing.

The photovoltaic device of the present invention is also more durable and stable (chemically and thermally) than existing devices due to the improved mechanical properties of the cadmium stannate film. In particular, cadmium stannate films deposited on glass substrates have good adhesion, are reasonably hard and scratch resistant, and exhibit high stability at elevated temperatures and over long periods of time. Moreover, the cadmium stannate films are less affected by post-deposition processing (i.e., CdTe deposition or $CdCl_2$ heat-treatment) than conventional TCO films, thus improving process reproducibility and product yield.

A significant advantage associated with the photovoltaic device of the present invention is the improved device performance due to the high resistivity and high transmittance of the zinc stannate film 26. As will be appreciated by those of skill in the art, the conversion efficiency of a heterojunction semiconductor device can be increased by reducing the window layer absorption, which increases short-circuit current ($J_{sc}$). In CdS/CdTe solar cells, this is achieved by reducing the thickness of the CdS film to improve the blue spectral response. However, a relatively thin CdS film increases the probability of pinholes thereby forming localized TCO/CdTe junctions, which generally results in a reduced open-circuit voltage ($V_{oc}$) and fill factor. During CdTe depositions and subsequent $CdCl_2$ heat treatment, the CdS film is either partially or completely consumed forming a $CdS_{1-x}Te_x$ intermixed layer. The CdS consumption reportedly increases as the CdS film thickness decreases (B. E.) McChadless and S. S. Hegedus, 22nd IEEE SPVC Proc. (1991) pp. 967–972). As the CdS film thins, additional pinholes can develop and create localized TCO/CdTe junctions, which reduce the open circuit voltage and fill factor. The photovoltaic device of the present invention minimizes these problems by including a zinc stannate film 26 between the TCO film 25 and the first semiconductor layer 28 (the CdS window layer). Because the resistivity of the zinc stannate film 26 matches the resistivity of the CdS window layer, the CdS film can be deposited in a thin layer without sacrificing open-circuit voltage ($V_{oc}$) and fill factor (F.F.).

An atomic force micrograph of the surface of a zinc stannate film was shown in FIG. 3 of our prior application Ser. No. 09/149,430 As is evident from this figure, zinc stannate films 26 have very smooth surfaces with average surface roughnesses of ~20 Å. It is well known that the probability of pinhole formation increases as the surface roughness of the underlying layer increases. See A. Rohatgi, et al., 22nd IEEE SPVC Proc. (1991) pp. 962–966. Thus, because of the smooth surface morphology of the zinc stannate film, the likelihood of pinhole formation in the photovoltaic device of the present invention is reduced as compared to conventional devices without a zinc stannate film.

Zinc stannate films are not etched by strong acids (e.g., HCl, $HNO_3$ and nitric/phosphoric acid), thus are resistant to the chemicals used in conventional ohmic contact processing. Because the zinc stannate film functions as a "stop etch" protective buffer layer, the photovoltaic devices of the present invention are much less likely than conventional devices to short as a result of over etching.

Another significant advantage associated with the photovoltaic device of the present invention is the improved mechanical properties due to the buffering effect of the zinc stannate buffer film. In particular, the zinc stannate films deposited on TCO-coated substrates have remarkably good adhesion and are less affected by $CdCl_2$ heat treatment than conventional photovoltaic devices, thus improving process reproducibility and product yield.

A yet further significant advantage of the photovoltaic device of the present invention is the improved reproducibility in device performance as a result of the zinc stannate buffer film. This is clearly seen in FIG. 4 of our prior application Ser. No. 09/149,430 which shows the efficiency of 30 identically processed devices (18 $Cd_2SnO_4$-based CdTe cells and 12 $SnO_2$-based CdTe cells), all of which included a zinc stannate film (no anti-reflection coating). The devices had an average efficiency of 13.83% with a standard deviation of 0.375.

EXAMPLES

The following examples demonstrate the practice and utility of the present invention but are not to be construed as limiting the scope thereof. Any suitable laboratory equipment known to those skilled in the art can be used to fabricate films and solar cells and analyze their electrical and optical properties. In the examples, cadmium stannate layers were deposited onto substrates using a modified SC-3000 evaporation system, manufactured by CVC Products, Inc. Optical measurements were made with a Cary 2300 spectrophotometer, manufactured by Varian Company.

Examples 1–4

Photovoltaic devices as shown in FIG. 1 were fabricated by the method of FIG. 2C. Films of cadmium stannate (TCO), zinc stannate (buffer) and CdS (window) were all deposited by RF magnetron sputtering at room temperature (about 20°–40° C.). The sputtering was carried out in a modified CVC SC-3000 system, evacuated to a base pressure of about $1\times10^{-6}$ Torr and then backfilled with high purity oxygen (for cadmium stannate and zinc stannate films) or argon (for CdS film). Corning 7059 glass or soda-lime glass was placed in a sample holder parallel to the target surface. No antireflective coating was used on the substrates. The distance between the substrate and the target was varied from 6 to 9 cm. Commercial hot-press oxide targets were used in this work. Deposition was performed at a partial pressure of $10–20\times10^{-3}$ Torr, with the rf power between 50 and 150 watts. The electrical, optical and compositional properties of these films were characterized using Hall effect measurements, optical and infrared spectroscopy, X-ray diffraction (XRD), scanning electron microscopy (SEM) and atomic force microscopy (AFM).

Once the first three layers were deposited, the device was annealed in hydrogen at 400° C. for 15 minutes. Following this annealing step, a CdTe film approximately 10 micrometers thick was deposited by close-space sublimation techniques. During deposition, the substrate and source temperatures were 625° C. and 660° C., respectively. The space between the substrate and the source was 0.2 cm. Deposition was initiated at a total pressure of 15 Torr in a $He/O_2$ ambient (14.5 Torr He, 0.5 Torr $O_2$). After CdTe deposition, the devices received a $CdCl_2$ vapor treatment at 400° C. for about 15 minutes in air. Finally, a HgTe-doped graphite paste back contact was applied to the devices.

Figure 5:
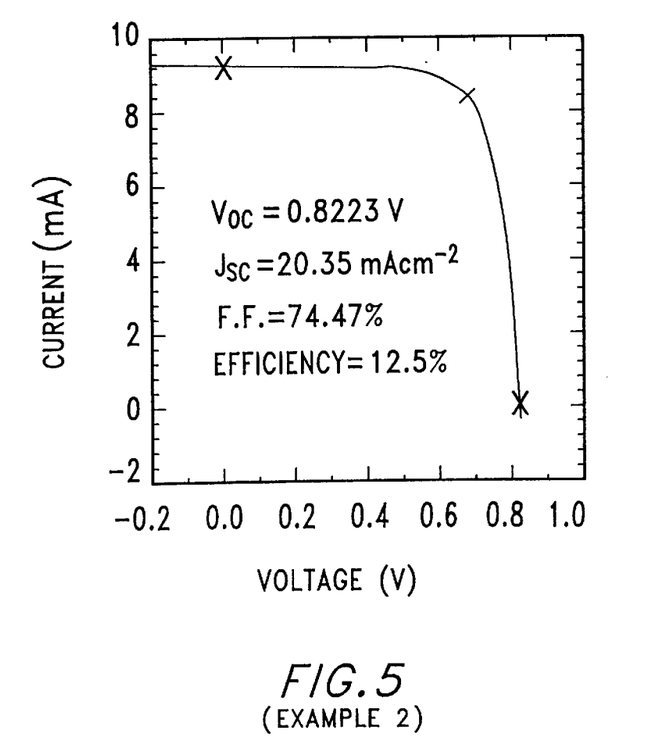
FIG. 5 is a graph of current versus voltage for a photovoltaic device of the present invention.

A limited number of CdS/CdTe thin-film solar cells fabricated by the process of FIG. 2C were tested. In these cells, the cadmium stannate and zinc stannate films had thicknesses of about 2500 Å and about 1000 Å, respectively. The thickness of the CdS window layer was varied from about 1500 Å to about 2500 Å. Test results for these cells, including open circuit voltage $V_{oc}$, short circuit current density $J_{sc}$, fill factor (F.F.) and efficiency are shown in Table 2. These results are extremely encouraging, demonstrating that thin-film solar cells offering high performance and high reproducibility can be fabricated using the process of the invention, with all its advantages. In Example 2, an NREL-confirmed efficiency of 12.5 percent was achieved. FIG. 5 shows the current-voltage curve for this cell.

TABLE 2

| Example | Voc (mV) | Jsc (mA/cm2) | F.F. (percent) | Efficiency (percent) |
|---------|----------|--------------|----------------|----------------------|
| 1 | 820 | 20.9 | 70.5 | 12.1 |
| 2 | 810 | 20.6 | 74.8 | 12.5 |
| 3 | 814 | 20.7 | 72.8 | 12.3 |
| 4 | 814 | 21.1 | 71.9 | 12.4 |

Conclusions:

The preliminary device results of Examples 1–4 demonstrated that cells produced by the method of the present invention provide high open-circuit voltage, high fill factor and lower short-circuit current density values. The lower current density values can be attributed to the slightly lower transmission of the cadmium stannate TCO layers and the higher absorption of the thicker sputtered CdS films. The lower transmission of the cadmium stannate layers can be improved by modifying the temperature profile of the CdTe deposition step (namely, by post-thermal annealing of the first three layers). The higher absorption of the sputtered CdS layers can be reduced by reducing the thickness of the sputtered CdS layer through optimizing the thickness of the zinc stannate and cadmium stannate layers. Thus, it is expected that CdS/CdTe cells with efficiencies approaching 14 percent can be produced by optimizing the process of the invention.

Hypothetical Example 5

CdS/CdTe thin-film solar cells are fabricated by the inventive alternate method of FIG. 3 and tested as described above. Electrical properties comparable to those of Examples 1–4 are obtained.

Hypothetical Example 6

CdS/CdTe thin-film solar cells are fabricated by the inventive alternate method of FIG. 4 and tested as described above. Electrical properties comparable to those of Examples 1–4 are obtained.

The foregoing description is considered as illustrative only of the principles of the invention. Further, since numerous modifications and changes will readily occur to those skilled in the art, it is not desired to limit the invention to the exact structures and processes shown as described above. Accordingly, resort may be made to all suitable modifications and equivalents that fall within the scope of the invention as defined by the claims which follow.

Although the present invention has been described with reference to preferred embodiments, numerous modifications and variations can be made and still the result will come within the scope of the invention. No limitation with respect to the specific embodiments disclosed herein is intended or should be inferred.

We claim:

1. Method of fabricating a thin-film semiconductor heterojunction photovoltaic device, comprising the steps of:
   a) depositing a layer of cadmium stannate on a transparent substrate by radio frequency sputtering at ambient temperature to act as a transparent conductive oxide (TCO) layer forming a front contact;
   b) depositing a zinc stannate layer on said TCO layer by radio frequency sputtering at ambient temperature to form a buffer layer;
   c) depositing a first semiconductor window layer upon said buffer layer;
   d) depositing a second semiconductor layer upon said window layer to form a heterojunction; and
   e) heat treating the device formed by steps (a)–(d) to convert said cadmium stannate layer to a substantially single-phase material with a spinel crystal structure.

2. The method of claim 1, wherein said first and second semiconductor layers are cadmium sulfide and cadmium telluride, respectively.

3. The method of claim 1, wherein said layers of cadmium stannate and zinc stannate are applied in amorphous form.

4. The method of claim 1 which further comprises treatment with cadmium chloride at elevated temperature and the depositing of a thin electrically conductive film upon said cadmium telluride layer to serve as a rear electrical contact.

5. The method of claim 1, wherein said window layer is deposited by radio frequency sputtering at ambient temperature and said cadmium telluride is deposited by close space sublimation at a temperature of at least about 500° C., which temperature is effective to convert said cadmium stannate to a single-phase spinel crystal structure.

6. The method of claim 1, wherein said second semiconductor layer is deposited at a temperature in the range of from ambient temperature to about 550° C., followed by heat treatment of the device at a temperature in the range of from about 500° to about 630° C.

7. The method of claim 6 wherein said second semiconductor layer is deposited by electrodeposition, screen printing, sputtering, spraying or physical vapor deposition (PVD).

8. The method of claim 1 wherein said window layer is applied by close space sublimation followed by the depositing of said second semiconductor layer by close space sublimation.

9. The method of claim 8, wherein the close space sublimation of said window layer is carried out at a temperature in the range of from about 500° C. to about 600° C. and the close space sublimation of said second semiconductor layer is carried out at a temperature in the range of from about 500° C. to about 630° C.

10. A thin-film photovoltaic device prepared by the method of claim 1.

11. A thin-film photovoltaic device prepared by the method of claim 5.

12. A thin-film photovoltaic device prepared by the method of claim 6.

13. A thin-film photovoltaic device prepared by the method of claim 8.

14. A method of fabricating a thin-film CdS/CdTe heterojunction photovoltaic device, comprising the steps of:
   a) depositing a layer of cadmium stannate on a transparent substrate by radio frequency sputtering at ambient temperature to act as a TCO layer forming a front contact;
   b) depositing a zinc stannate layer on said TCO layer by radio frequency sputtering at ambient temperature to form a buffer layer;
   c) depositing a cadmium sulfide window layer upon said buffer layer by radio frequency splattering at ambient temperature; and
   d) depositing a layer of cadmium telluride upon said window layer by close space sublimination at elevated temperature, thus forming a heterojunction, wherein the temperature profile for the close space sublimation of said cadmium telluride is effective to convert said cadmium stannate layer to a substantially single-phase material with a spinel crystal structure.

15. The method of claim 14, wherein said layers of cadmium stannate and zinc stannate are applied in amorphous form.

16. The method of claim 14, wherein said layer of cadmium telluride is applied at a temperature in the range of from about 500° C. to about 630° C.

17. The method of claim 14, further comprising the steps of cadmium chloride treatment at elevated temperature, which temperature is lower than that in claim 14 (d), and the depositing of a thin electrically conducting film upon said cadmium telluride layer to serve as a rear electrical contact.

18. The method of claim 11, wherein the first three layers of cadmium stannate, zinc stannate and cadmium sulfide are annealed in hydrogen at a temperature in the range of from about 300° C. to about 450° C. before said cadmium telluride layer is deposited.

* * * * *